United States Patent [19]
Yamada et al.

[11] Patent Number: 5,081,413
[45] Date of Patent: Jan. 14, 1992

[54] METHOD AND APPARATUS FOR MEASURING AC POWER

[75] Inventors: Chitoshi Yamada; Jin-ichi Kikuchi, both of Tokyo, Japan

[73] Assignee: Ohkura Electric Co., Ltd., Tokyo, Japan

[21] Appl. No.: 479,459

[22] Filed: Feb. 13, 1990

[30] Foreign Application Priority Data

Feb. 23, 1989 [JP] Japan ............................. 1-41705

[51] Int. Cl.⁵ ............................................. G01R 21/06
[52] U.S. Cl. ................................. 324/142; 324/141; 324/83 R; 364/481
[58] Field of Search ............... 324/141, 142, 83 R; 328/160; 364/481

[56] References Cited

FOREIGN PATENT DOCUMENTS

| 2063105 | 8/1977 | Fed. Rep. of Germany | 324/142 |
| 0080565 | 4/1987 | Japan | 324/142 |
| 0759970 | 9/1980 | U.S.S.R. | 324/142 |
| 2031166 | 4/1980 | United Kingdom | 324/142 |

Primary Examiner—Kenneth A. Wieder
Assistant Examiner—Jose M. Solis
Attorney, Agent, or Firm—Oblon, Spivak, McClelland, Maier & Neustadt

[57] ABSTRACT

A method and apparatus for measuring AC power, in which a measured digital value of an AC voltage is decomposed into two components with a phase difference of 90° therebetween, while a measured digital value of an AC current is decomposed into two components with a phase difference of 90° therebetween, and a scalar product of a first vector consisting of the two components of the AC voltage and a second vector consisting of the two components of the AC current is calculated. The scalar product thus calculated represents active power carried by the AC current at the AC voltage. Separately, absolute value of vector product of the first vector and the second vector may be calculated, which absolute value of the vector product represents reactive power carried by the AC current at the AC voltage.

4 Claims, 2 Drawing Sheets

METHOD AND APPARATUS FOR MEASURING AC POWER

BACKGROUND OF THE INVENTION

1. Field of the Invention

This invention relates to a method and apparatus for measuring AC (alternating current) electric power, and more particularly, to a method and apparatus in which active power is determined as the scalar product of an AC voltage vector and an AC current vector while reactive power is determined as the absolute value of the vector product of the above-mentioned two vectors.

2. Description of the Prior Art

With the advance of control engineering, various techniques have been developed and used to measure voltage and current as digital quantities so as to determine power from such digital quantities. In an example of the prior art as shown in FIG. 4, voltage input 21 and current input 22 are converted in digital quantities by analog-digital converters 23 and 24, respectively. A multiplier 25 calculates the product of the voltage input and the current input in digital quantities, and harmonics components of the product are eliminated by a low-pass filter 28. Thus, electric power P is produced at an active power terminal 32. The reason for using the low-pass filter 28 is in that the product of the voltage and current includes a second harmonics component as shown in the second term on the right-hand side of the following equation.

$$\sqrt{2}\, V\sin(\omega t) \cdot \sqrt{2}\, I\sin(\omega t - \theta) = VI\cos\theta - VI\cos(2\omega t - \theta) \quad (1)$$

Here,
V: RMS (root means square) value of voltage
I: RMS value of current
$\omega$: angular velocity
$\theta$: phase difference
t: time The first term on the right-hand side of the equation (1) represents active power P, and the second term thereof represents ripples or harmonics.

To eliminate the second term harmonics of the right-hand side of the above equation without using the low-pass filter 28, it has been practiced to integrate the product of the equation (1) over a time span corresponding to integral multiple of the fundamental period T of the voltage or current. In this case, integration of the right-hand side second term of the equation (1) becomes zero.

The reactive power Q can be calculated as follows; namely, the digital values of the voltage and current are squared by multipliers 26, 27, respectively, and harmonics thereof are removed by low-pass filters 29, 30, respectively, and then calculation of the following equation is carried out by a calculating circuit 31.

$$Q = \sqrt{(V \cdot I)^2 - P^2} \quad (2)$$

The value of the reactive power Q thus determined is delivered to a reactive power terminal 33.

To control and/or protect electric facilities, high-speed detection of electric power is necessary. However, with the method using the above low-pass filter 28 for elimination of harmonics, the speed of power measurement is limited by that of the low-pass filter 28, and as long as suppressing harmonics content below a certain level through harmonics elimination, the speed of power measurement cannot be made fast enough for certain applications. Theoretically, it is possible to raise the speed of power measurement by sacrificing the level of harmonics content, but sometimes presence of harmonics in excess of a certain level cannot be tolerated. Thus, there is a pressing need for the development of a method for high-speed power measurement or a power measuring method with a quick response.

With the conventional method using the integration of the equation (1) over an integral multiple of the fundamental period T, when the frequency fluctuates, it becomes necessary to modify the integrating time in response to the frequency fluctuation, i.e., fluctuation in the period. Thus, such power measuring apparatus must have a frequency measuring means which is not necessary for power measurement itself and adds unnecessary cost to the power measuring apparatus. Further, power measurement is effected only after the frequency measurement, so that power measurement is possible only once in two cycles. Thus, the method using such integration has a shortcoming in that its power measurement is slow.

SUMMARY OF THE INVENTION

Therefore, an object of the present invention is to solve the above-mentioned shortcoming of the prior art and to meet the need for quick measurement by providing such a method and apparatus for AC electric power measurement which are free from effects harmonics.

In a method according to the present invention, a measured digital value of an AC voltage is decomposed into two components with a phase difference of 90° therebetween, and a measured digital value of an AC current is also decomposed into two components with a phase difference of 90° therebetween, and then a scalar product of a first vector consisting of the two components of the AC voltage and a second vector consisting of the two components of the AC current is calculated. The scalar product thus determined represents active power carried by the AC current at the AC voltage.

Reactive power carried by the AC current at the AC voltage can be determined as the absolute value of a vector product of the above-mentioned first vector and the above-mentioned second vector.

An AC electric power measuring apparatus according to the present invention uses a first 90°-phase-difference separating-filter connected to an input voltage terminal and separating a measured digital value of an AC voltage from the input voltage terminal into two components, and a second 90°-phase-difference separating-filter connected to an input current terminal and separating a measured digital value of an AC current from the input current terminal into two components. Each of the 90°-phase-difference separating-filters separates the input thereto into two components while keeping the phase difference between the two components at a constant value of 90° over a given frequency range. The apparatus also has a multiplier which is connected to the two separating-filters and calculates scalar product of a first vector consisting of the above two components of the AC voltage and a second vector consisting of the above two components of the AC current. The scalar product thus calculated by the multiplier represents active power carried by the AC current at the AC voltage.

An apparatus for measuring AC reactive power according to the invention uses the same first and second 90°-phase-difference separating-filters as above, so as to produce the same first and second vectors as above representing the AC voltage and current respectively. The apparatus for reactive power measurement uses such a multiplier which is connected to the two separating-filters and calculates absolute value of vector product of the first vector and the second vector. The absolute value of the vector product thus calculated represents the reactive power carried by the AC current at the AC voltage.

BRIEF DESCRIPTION OF THE DRAWING

Like parts are designated by like numerals and symbols throughout different views of the drawings.

DESCRIPTION OF THE PREFERRED EMBODIMENT

Figure 1:
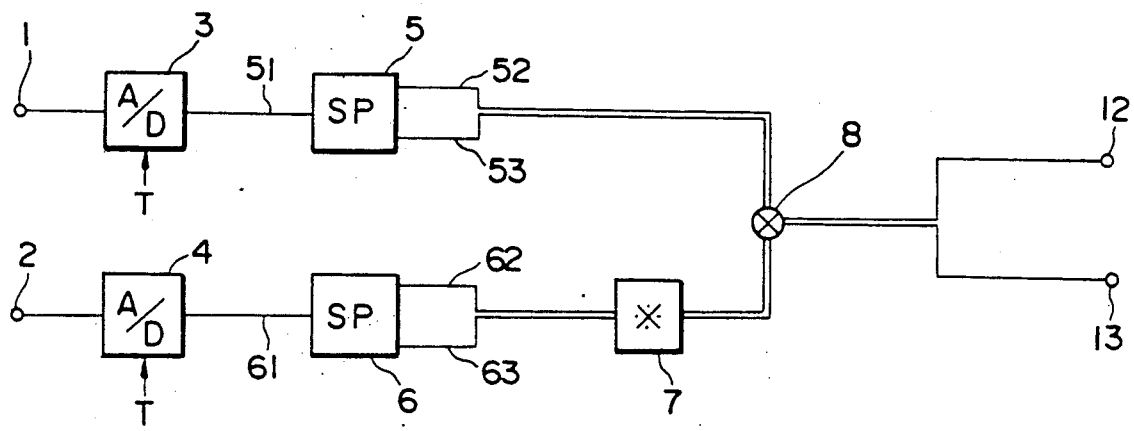
FIG. 1 is a block diagram for explanation of the principle of the present invention.

Referring to an explanatory diagram of FIG. 1, with the method according to the invention, a measured digital value 51 of an AC voltage is divided into two voltage components 52, 53 with a phase difference of 90° therebetween. The two voltage components 52, 53 define a first vector. A measured digital value 61 of an AC current is divided into two current components 62, 63 with a phase difference of 90° therebetween. The two current components 52, 53 define a second vector. Active power carried by the AC current of the value 61 at the AC voltage of the value 51 can be determined by calculating the scalar product of the above first and second vectors. The reactive power carried by the AC current of the value 61 at the AC voltage of the value 51 can be determined by calculating the absolute value of vector product of the above first and second vectors.

The reasons why the active power is given by the scalar product of the first or voltage vector and the second or current vector and why the reactive power is given by the absolute value of the vector product of the first vector and the second vector will be explained now.

If the voltage input 1 and the current input 2 of FIG. 1 are represented by vectors $\bar{v}$ and $\bar{i}$ of exponential expression, respectively, such vectors are given by $$\bar{v} = V e^{j\omega t} \quad (3)$$

$$\bar{i} = I e^{j(\omega t - \theta)} \quad (4)$$

If phasor power $\bar{s}$ is defined by the product of a voltage $\bar{v}$ and conjugate $\bar{i}^*$ of a current $\bar{i}$, there is the following relationship. Here, the conjugate of the current is used merely to make the sign of the reactive power for a lagging current plus, and when the sign of the reactive power does not matter, conjugate of the voltage may be used instead of the current conjugate in the following calculation.

$$\bar{s} = \bar{v} \cdot \bar{i}^* = V I e^{j\omega t} \cdot e^{-j(\omega t - \theta)} = V I e^{j\theta}$$

By using the Euler's formula on complex number, i.e., $e^{j\theta} = \cos\theta + j(\sin\theta)$, the above relationship can be rewritten as follows.

$$\bar{s} = V I \{\cos\theta + j(\sin\theta)\} = V I \cos\theta + j(V I \sin\theta) \quad (5)$$

The first term on the right-hand side of the equation (5) coincides with the first term on the right-hand side of the equation (1), and it represents the active power P. Further, the first term on the right-hand side of the equation (5) coincides with the definition of scalar product of the two vectors $\bar{v}$ and $\bar{i}$. The fact that the second term on the right-hand side of the equation (5) minus the imaginary unit j coincides with the reactive power Q of the equation (2) can be easily proven by using the above active power P. Further, the second term on the right-hand side of the equation (5) coincides with the definition of the absolute value of vector product of the two vectors $\bar{v}$ and $\bar{i}$.

In the present invention, an analog voltage input 1 is converted into digital quantity by an analog-digital converter 3, so as to produce a digital voltage input 51 to a 90°-phase-difference separating-filter 5. Similarly, an analog current input 2 is converted into digital quantity by an analog-digital converter 4, so as to produce a digital voltage input 61 to a 90°-phase-difference separating-filter 6.

Figure 2:
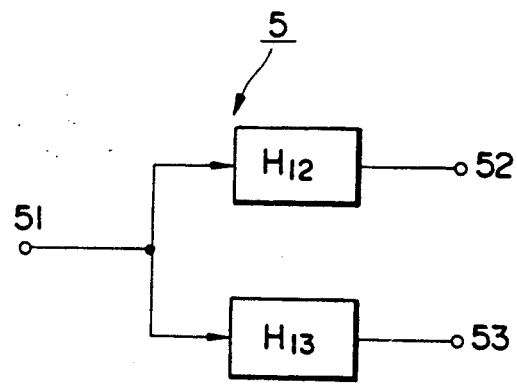
FIG. 2 is a simplified block diagram of 90°-phase-difference separating-filter.

FIG. 2 shows a block diagram of an example of the 90°-phase-difference separating-filter 5. The illustrated separating-filter 5 separates its input 51 into two outputs 52, 53 having a phase difference of 90° therebetween. If the transfer function between the input 51 and one output 52 is represented by $H_{12}$ and the transfer function between the input 51 and the other output 53 is represented by $H_{13}$, there is the following relationship.

$$|H_{12}| = |H_{13}| = 1 \quad (6)$$

Details of such 90°-phase-difference separating-filter 5 are discussed in Chapter 12 Section 6 (pp. 347–352) of "Theory and Design of Transmission Circuit" (in Japanese), by Dr. Hitosi Watanabe, Published by Ohm-sha of Tokyo in 1968.

The two outputs 52, 53 from the 90°-phase-difference separating-filter 5 in response to the voltage input 51 can be treated as components of the following vector voltage $\bar{v}_1$.

$$\bar{v}_1 = V e^{j(\omega t - \alpha)} \quad (7)$$

Here, $\alpha$ is a phase angle which depends on the characteristics of the 90°-phase-difference separating-filter 5.

The two outputs 62, 63 from the 90°-phase-difference separating-filter 6 in response to the current input 61 can be treated as components of the following vector current $\bar{i}_1$.

$$\bar{i}_1 = I e^{j(\omega t - \alpha - \theta)} \quad (8)$$

The sign of the reactive power for a lagging current is assumed to be plus in the embodiment. Hence, the phasor power $\bar{s}$ is calculated in the following manner by taking the conjugate $\bar{i}_1^*$ of the above current vector $\bar{i}_1$ through a conjugate circuit 7 and then taking the product of the above voltage vector and the current vector through a multiplier 8.

$$\begin{aligned}
\bar{s} &= \bar{v}_1 \cdot \bar{i}_1{}^* \\
&= V e^{j(\omega t - \alpha)} \cdot I e^{-j(\omega t - \alpha - \theta)} \\
&= V I e^{j\theta} \\
&= V I \cos\theta + j(V I \sin\theta)
\end{aligned} \quad (9)$$

The first term on the right-hand side of the equation (9) coincides with the first term on the right-hand side of the equation (5) and represents the active power P. Further, the first term on the right-hand side of the equation (9) agrees with the definition of the scalar product between the voltage vector $\bar{v}_1$ corresponding to the voltage input 1 and the current vector $\bar{i}_1$ corresponding to the current input 2.

The second term on the right-hand side of the equation (9) minus the imaginary unit j not only coincides with the reactive power Q of the equation (2) but also agrees with the definition of the absolute value of the vector product between the above-mentioned two vectors $\bar{v}_1$ and $\bar{i}_1$ as can be seen from the foregoing description with respect to the first term thereof. It is also noted that the equation (9) has only fundamental frequency terms and it is free from higher harmonics especially from the second harmonics $2\omega$.

The active power P and the reactive power Q from the multiplier 8 are delivered to the active power terminal 12 and the reactive power terminal 13, respectively.

Thus, the purpose of the invention, i.e., the provision of a method and apparatus for AC electric power measurement which are free from the effects of harmonics, is fulfilled.

EMBODIMENT

Figure 3:
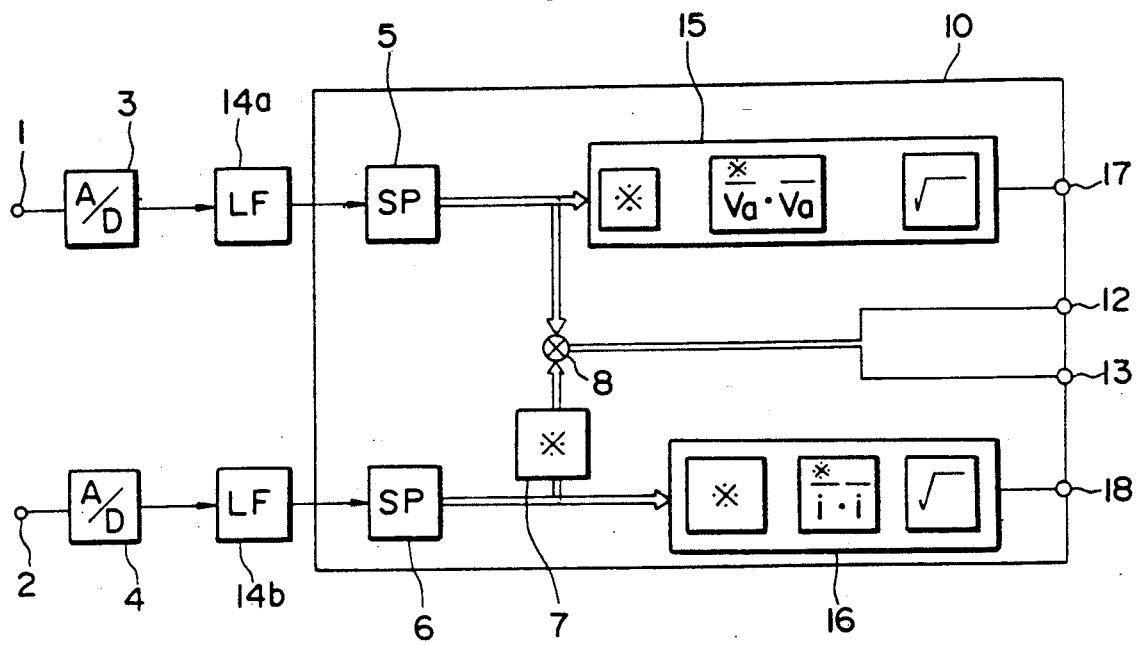
FIG. 3 is a schematic block diagram of an embodiment of the present invention.
Figure 4:
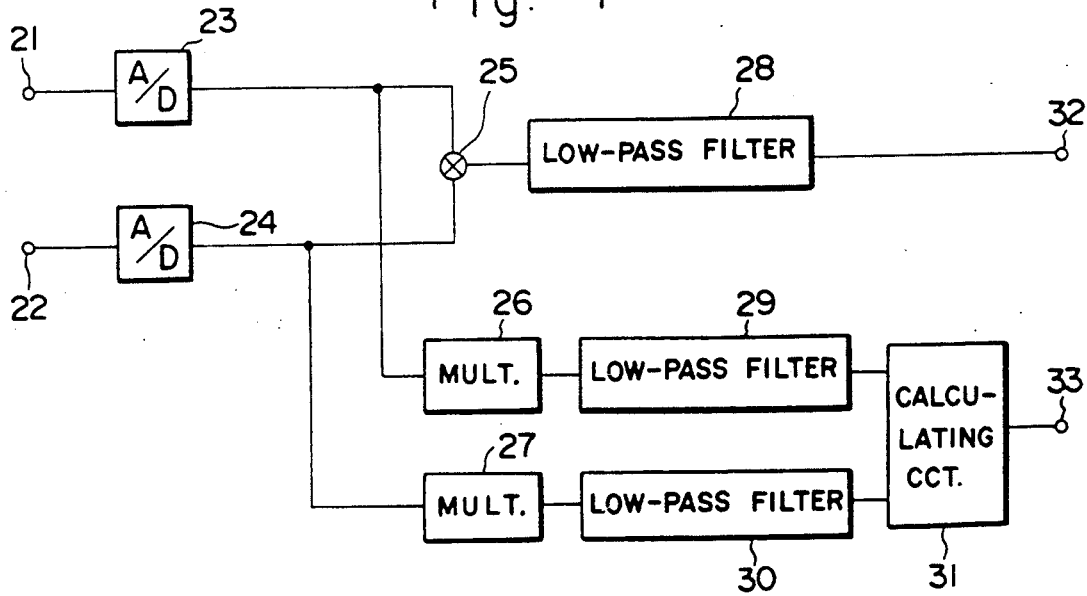
FIG. 4 is a block diagram of a power measuring apparatus of the prior art.

FIG. 3 shows a block diagram of a power measuring apparatus 10 based on the principle of the invention, which apparatus is suitable for measurement of commercial frequency power in power networks. To avoid adverse effects of harmonics in the power network, low-pass filters 14a and 14b are connected to the output sides of the analog-digital converters 3 and 4, respectively. Further, RMS values of the voltage and current after the elimination of the higher harmonics are determined by the RMS value circuits 15 and 16, respectively. The thus determined RMS values of the voltage and current are delivered to the voltage terminal 17 and the current terminal 18, respectively.

For simplicity, only the case of single phase system has been described, but the method and apparatus of the present invention can be applied to three-phase and other poly-phase AC power measurement. In addition to the RMS value measurement, the method and apparatus of the invention can be also used for the measurement of the phase angle $\theta$ between the voltage and current.

As described in detail in the foregoing, with the method and apparatus for measuring AC power according to the present invention, a measured digital value of an AC voltage is decomposed into two components with a phase difference of 90° therebetween, and a measured digital value of an AC current is decomposed into two components with a phase difference of 90° therebetween, and an active power is determined by calculating scalar product of a first vector consisting of said two components of the AC voltage and a second vector consisting of said two components of the AC current.

Thereby, the following outstanding effects can be achieved:

(a) A conventional low-pass filter for removing second harmonics components from the product of voltage and current can be dispensed with.

(b) Ripples in the measured value of the active power P and the reactive power Q can be suppressed to a very low level.

(c) Response is quick, because delay due to the use of low-pass filter is eliminated.

(d) The process and structure are simple because integration over full period of AC voltage or current is not used and precise measurement of such period is not required.

(e) Both the active power P and the reactive power Q can be measured simultaneously by a single apparatus.

What is claimed is:

1. A method for measuring AC power, comprising the steps of decomposing a measured digital value of an AC voltage into two components with a phase difference of 90° therebetween, said phase difference being unaffected by fluctuation in power frequency, decomposing a measured digital value of an AC current into two components with a phase difference of 90° therebetween, said phase difference being unaffected by fluctuation in power frequency, and calculating a scalar product of a first vector consisting of said two components of the AC voltage and a second vector consisting of said two components of the AC current, the scalar product thus determined representing active power carried by said AC current at said AC voltage.

2. A method as set forth in claim 1, further comprising the step of calculating an absolute value of a vector product of said first vector and said second vector, the absolute value of said vector product thus determined representing reactive power carried by said AC current at said AC voltage.

3. An apparatus for measuring AC electric power, comprising a first 90°-phase-difference separating-filter having two unit gain phase shifting elements each having one end thereof connected to an input voltage terminal and separating a measured digital value of an AC voltage from the input voltage terminal into two components with a phase difference of 90° therebetween, a second 90°-phase-difference separating-filter having two unit gain phase shifting elements each having one end thereof connected to an input current terminal and separating a measured digital value of an AC current from the input current terminal into two components with a phase difference of 90° therebetween, and a multiplier connected to said two separating-filters for calculating a scalar product of a first vector consisting of said two components of the AC voltage and a second vector consisting of said two components of the AC current, said scalar product representing active power carried by said AC current at said AC voltage.

4. An apparatus for measuring AC electric power, comprising a first 90°-phase-difference separating-filter having two unit gain phase shifting elements each having one end thereof connected to an input voltage terminal and separating a measured digital value of an AC voltage from the input voltage terminal into two components with a phase difference of 90° therebetween, a second 90°-phase-difference separating-filter having two unit gain phase shifting elements each having one end thereof connected to an input current terminal and separating a measured digital value of an AC current from the input current terminal into two components with a phase difference of 90° therebetween, and a multiplier connected to said two separating-filters for calculating an absolute value of vector product of a first vector consisting of said two components of the AC voltage and a second vector consisting of said two components of the AC current, said absolute value of vector product representing reactive power carried by said AC current at said AC voltage.

* * * * *